(12) United States Patent  
Bjorklund

(10) Patent No.: US 7,099,158 B1  
(45) Date of Patent: Aug. 29, 2006

(54) HOUSING FOR MODULES

(75) Inventor: Brian P. Bjorklund, Lilburn, GA (US)

(73) Assignee: BellSouth Intellectual Property Corp., Wilmington, DE (US)

( * ) Notice: Subject to any disclaimer, the term of this patent is extended or adjusted under 35 U.S.C. 154(b) by 189 days.

(21) Appl. No.: 10/656,741

(22) Filed: Sep. 5, 2003

Related U.S. Application Data

(60) Provisional application No. 60/447,151, filed on Feb. 13, 2003.

(51) Int. Cl.  
*H05K 7/16* (2006.01)

(52) U.S. Cl. ............. 361/725; 361/679; 361/724; 248/346.03; 439/208

(58) Field of Classification Search ............ 361/679, 361/724–725, 685; 312/223.1; 439/208; 248/515, 346.03  
See application file for complete search history.

(56) References Cited

U.S. PATENT DOCUMENTS

| | | | |
|---|---|---|---|
| 4,964,017 A * | 10/1990 | Jindrick et al. | 361/683 |
| 5,343,361 A * | 8/1994 | Rudy et al. | 361/710 |
| 6,151,206 A * | 11/2000 | Kato et al. | 361/681 |
| 6,405,139 B1* | 6/2002 | Kicinski et al. | 702/33 |
| 6,661,677 B1* | 12/2003 | Rumney | 361/818 |
| 6,697,262 B1* | 2/2004 | Adams et al. | 361/785 |
| 6,747,866 B1* | 6/2004 | Lebo et al. | 361/679 |

OTHER PUBLICATIONS

Telect, Inc., Splitter & WDM Fiber Optic Modules Description & Installation, manual, 2000, pp. 1-4, Issue A, Rev 0, Telect, Inc., US.  
Optelian Services LLC, Dual WDM Cassette, product bulletin, date unknown, Opetelian Services LLC, US.  
Optelian Services LLC, specifications, date unknown, Opetelian Services LLC, US.

* cited by examiner

*Primary Examiner*—Yean-Hsi Chang  
(74) *Attorney, Agent, or Firm*—Potomac Patent Group PLLC

(57) ABSTRACT

An apparatus for supporting and mounting at least one module on a surface may be provided. The apparatus may comprise a housing that may be attachable to a portion of the surface. The housing may have a channel that may be sized to receive and support at least a portion of at least one module. The apparatus may also include at least one mounting member on the housing for attaching the housing to the surface.

21 Claims, 4 Drawing Sheets

US 7,099,158 B1

HOUSING FOR MODULES

CROSS REFERENCE TO RELATED APPLICATION

The present application claims priority to U.S. Provisional Patent Application No. 60/447,151 filed Feb. 13, 2003, which is incorporated herein by reference in its entirety.

BACKGROUND

The subject invention generally and in various embodiments relates to housings, and more particularly to devices for supporting and mounting telecommunications modules.

Many telecommunications providers are using optical networks to provide multiple and high bandwidth telecommunications services to businesses or homes. To accommodate the increasing numbers of customers using such services, some telecommunications providers are bringing more optical fibers to Remote Terminal (RTs) or remote cabinets to facilitate the delivery of high bandwidth services to subscribers. The RTs may be used to provide traditional voice as well as Digital Subscriber Line (DSL) services, so that RTs used to provide a local loop of 500 to 2000 homes are not uncommon. Additionally, the RTs may serve business customers with dedicated fibers. To increase the capacity of the fibers that are taken to the RTs, Wavelength Division Multiplexing (WDM) modules, or cassettes, may be implemented. Such multiplexing modules increase the data-carrying capacity of an optical fiber by concurrently transmitting signals at different wavelengths through the same fiber. These multiplexing modules are housed in RT cabinets, which also include the fiber termination shelves, power shelves, and other hardware and electronics. A jumble of various components is often the result in crowded RT cabinets.

SUMMARY

Embodiments of the present invention may also include an apparatus for supporting and mounting at least one module on a surface. The apparatus may comprise a housing that may be attachable to a portion of the surface. The housing may have a channel therein that may be sized to receive and support at least a portion of at least one module therein. The apparatus may also include at least one mounting member on the housing for attaching the housing to the surface.

Embodiments of the present invention may include a housing for supporting and mounting at least one module. The housing may include a first panel member, a second panel member that may be connected to the first panel member, and a third panel member that may be connected to the second panel member opposite the first panel member. A slot may be formed between the first and third panel members and may also be capable of receiving at least one module. The housing may also include at least one mounting member that may be capable of mounting the housing to a surface.

Embodiments of the present invention may also include an apparatus for mounting at least one module on a surface. The apparatus may comprise housing means that may be attachable to the surface for forming a channel for receiving at least a portion of the at least one module therein, between a portion of the housing means and the surface. The apparatus may further include means for mounting the housing means to the surface.

Embodiments of the present invention may further include a method of mounting at least one module on an RT cabinet. The method may comprise forming an open ended channel on a portion of the cabinet, inserting at least a portion of the at least one module into the open ended channel and retaining the at least one module within the open ended channel.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

In the accompanying Figures, there are shown embodiments of the present invention wherein like reference numerals are employed to designate like parts and wherein.

DETAILED DESCRIPTION

Figure 1:
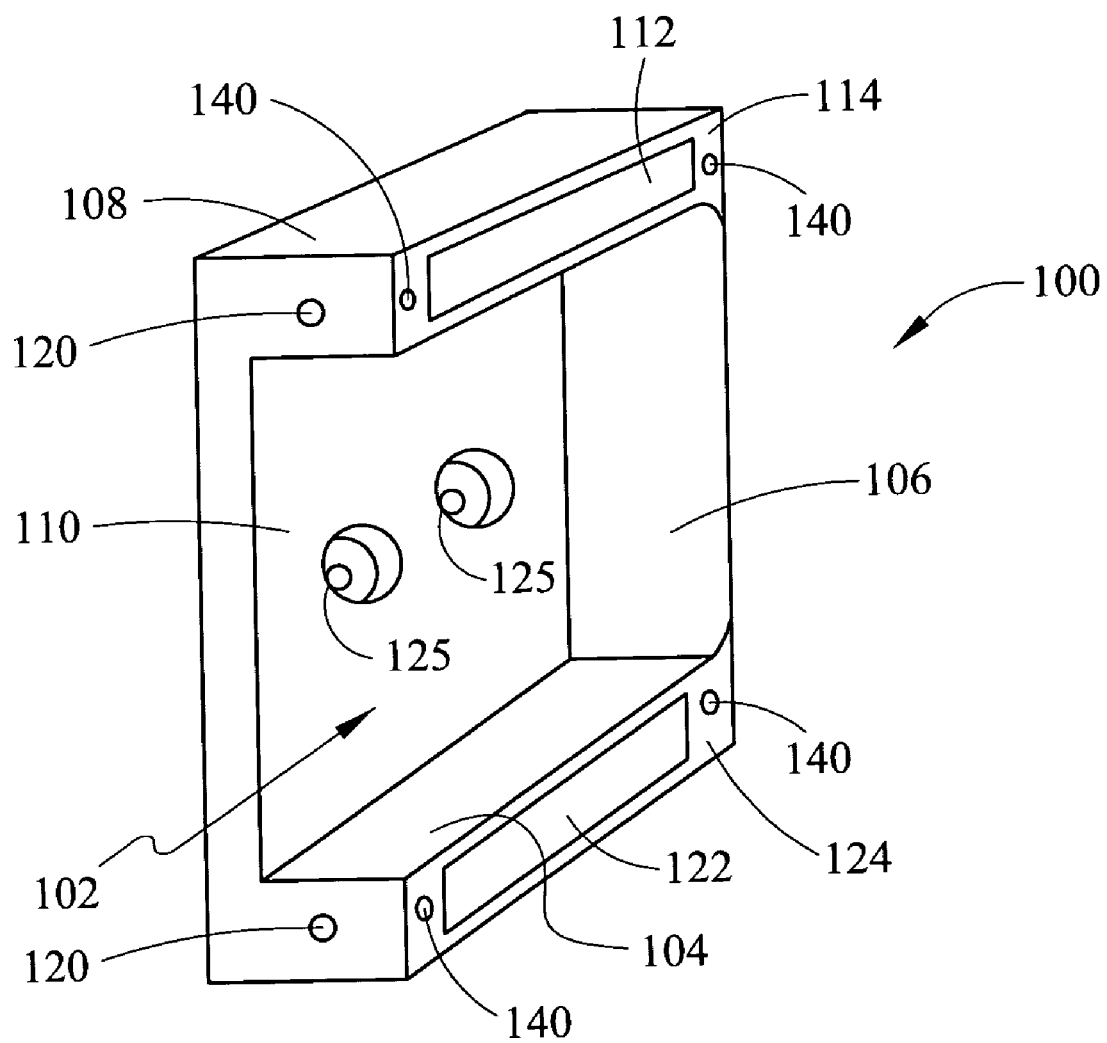
FIG. 1 is a perspective view of embodiments of a housing for a module according to the invention.

Referring now to the drawings for the purpose of illustrating the invention and not for the purpose of limiting the same, it is to be understood that standard components or features that are within the purview of an artisan of ordinary skill and do not contribute to the understanding of the various embodiments of the invention are omitted from the drawings to enhance clarity. In addition, it will be appreciated that the characterizations of various components and orientations described herein as being "vertical" or "horizontal", "right" or "left", "side", "top", "bottom", "upper" or "lower" are relative characterizations only based upon the particular position or orientation of a given component for a particular application.

Figure 2:
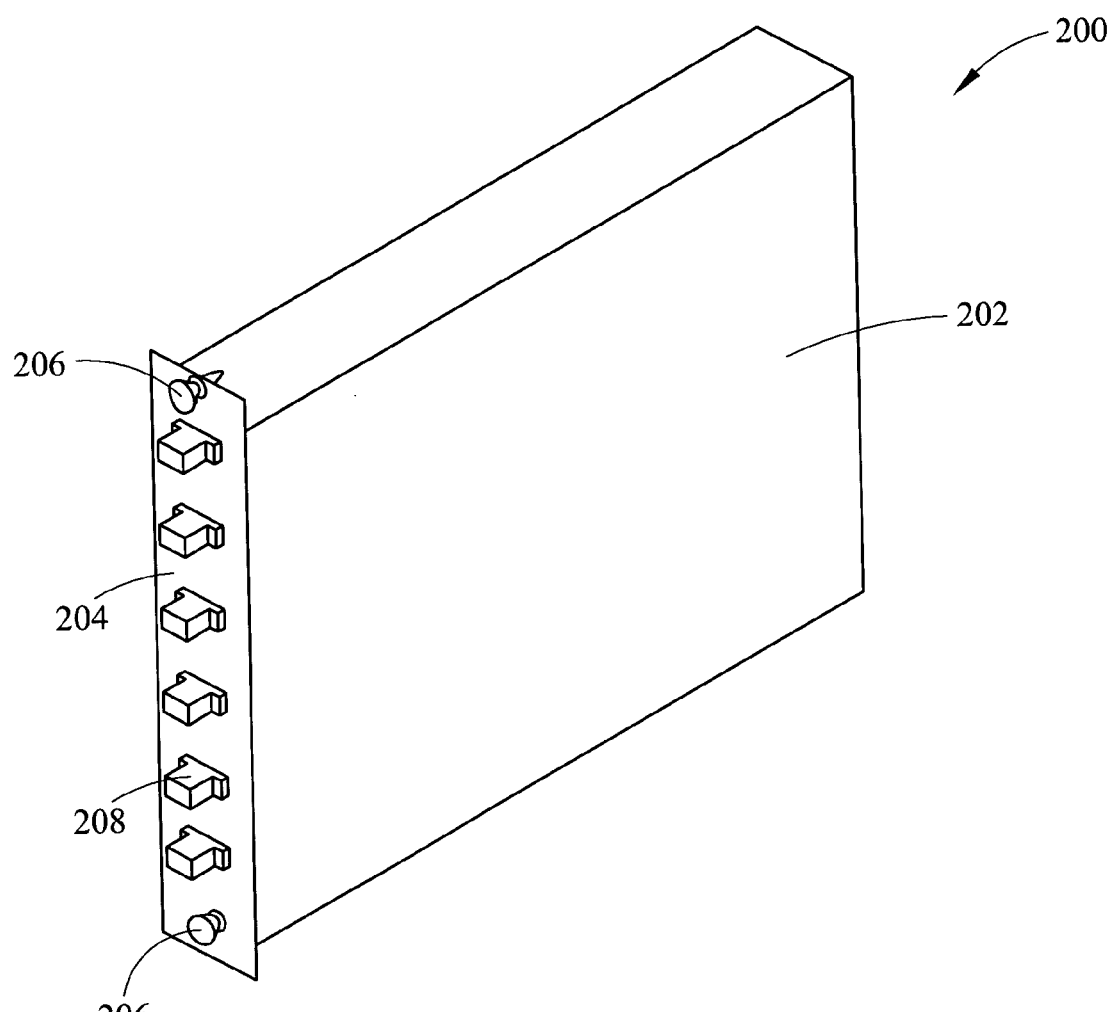
FIG. 2 is a perspective view of embodiments of a module.

FIG. 1 shows an embodiment of a housing 100 for a WDM-type, splitter or multiplexing module 200, an embodiment of which is shown in FIG. 2. The housing 100 may include a channel or slot 102 that may be defined by first, second and third panels 104, 106 and 108, respectively. The slot 102 may be, for example, U-shaped. The first arid second panels 104 and 106 may be parallel and may be joined to the third panel 108 to form the slot 102. The second panel 106 may be solid, as shown in FIG. 1, or may have one or more apertures therethrough to receive input to a module 200. The housing 100 may be configured to accommodate the module 200, or several modules 200. The housing 100 may include a back cover panel 110 attached to the first, second and third panels 104, 106, 108.

Figure 5:
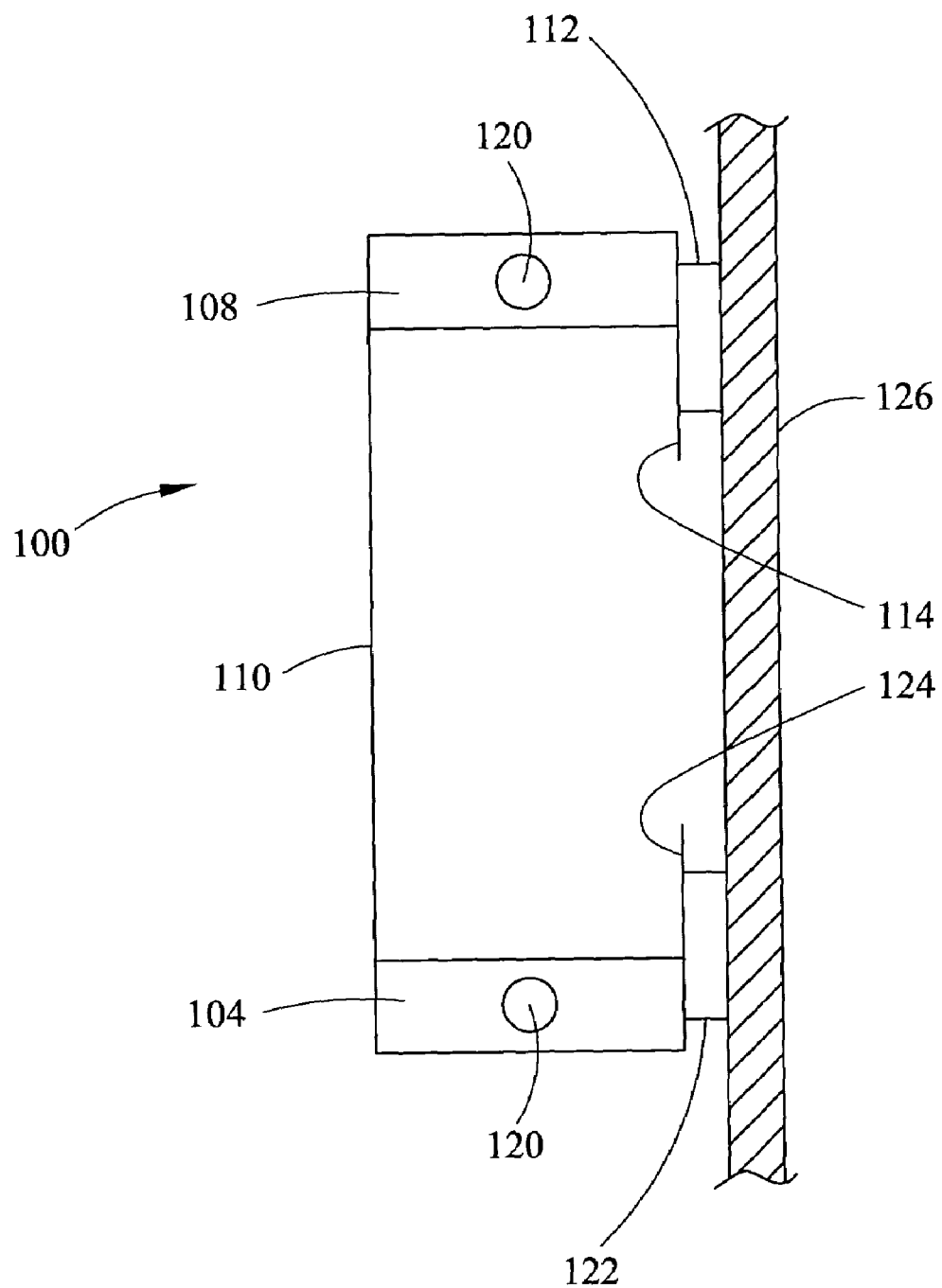
FIG. 5 is a side view of embodiments of the housing shown in FIG. 3.

The housing 100 may include a first magnet 112 attached to a first side 114 of the third panel 108. The first side 114 may extended further toward the first panel 104, much like a flange, to assist in supporting the module 200. See FIG. 5. The magnet 112 may be, for example, in the form of a magnetic strip with adhesive backing for attachment to the housing 100. It would be appreciated that other types of magnets, such as solid magnets or electromagnets, for example, and other methods of attachment to the housing 100 may be used for mounting the housing 100 such as, for example, screws, hook and loop fasteners, etc. The magnet 112 may make it possible to removably mount the housing 100 to a magnet-attracting surface, such as a ferrous surface 126 next to or on a fiber optic termination shelf 300 in an RT cabinet 400 or other bandwidth distribution center, which is fabricated from, for example, steel or the like.

The module 200 may include a rectangular box 202, which may contain various multiplexing, splitting and other components, and a face plate 204 attached to the box 202. The face plate 204 may support two standardized fasteners 206, such as, for example, push-on pins, quick-connect plungers, etc., and may include a number of fiber connectors 208 connected with fiber jumpers 302 to the fiber optic termination shelf 300. The module 200 may be slid into the slot 102 such that the fasteners 206 may be inserted into corresponding orifices 120, which may be provided in the first and third panels 104, 108 of the housing 100, thereby providing a means for receiving the fasteners 206 and locking the module 200 in the housing 100. Other means for receiving fasteners 206 may be provided for the particular fastener that may be employed on the module 200.

Figure 3:
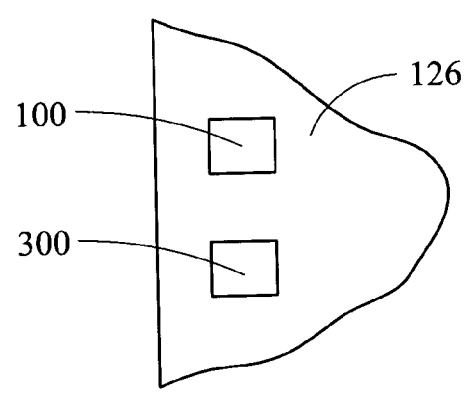
FIG. 3 is a front view of embodiments of the housing of FIG. 1, shown mounted on a surface of a telecommunications Remote Terminal cabinet.

In another embodiment, the housing 100 may include a second magnet 122 attached to a first side 124 of the first panel 104 to provide additional support for mounting the housing 100 on the metal surface 126. See FIG. 3 and FIG. 5. The first side 124 may extended further toward the third panel 108, much like a flange, to assist in supporting the module 200. See FIG. 5. Yet other embodiments may include, for example, three or more magnets, magnetized surfaces, hook and loop fasteners, etc. Permanent mounting may also be provided by fastening the housing 100 to the surface 126 through holes 140 on the first and third panels 104 and 108 or on the cover panel 110 through rear holes 125.

Figure 4:
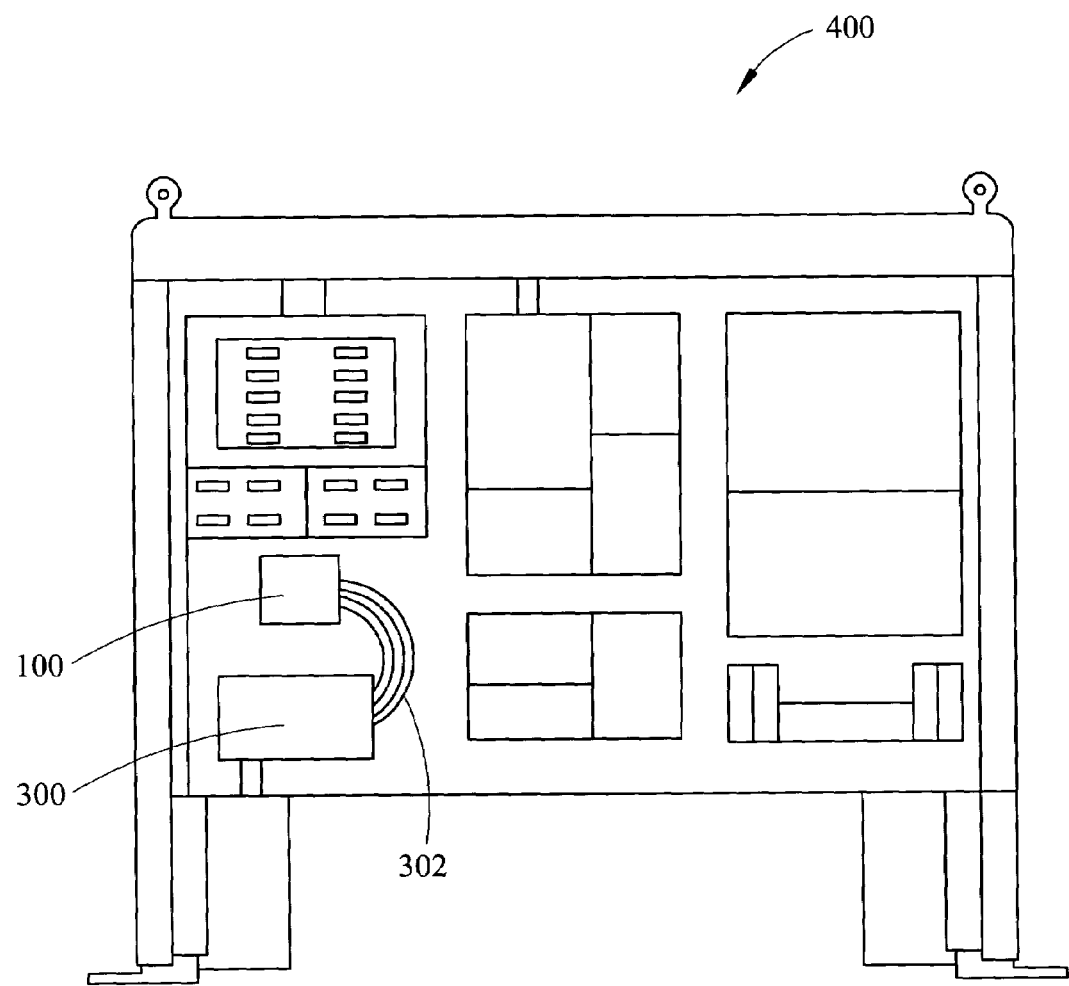
FIG. 4 is a front view of embodiments of the Remote Terminal cabinet showing the housing of FIG. 1.

The housing 100 of the invention, in various and several embodiments, may provide an inexpensive and convenient device for mounting modules 200 and similar devices inside RT cabinets 400, such as the one shown in FIG. 4, in an orderly manner. The housing 100 may be fabricated, for example, as one piece by injection molded plastic, although other materials, including, for example, metals, sheet metals, and methods of manufacture that are available to a skilled artisan may also be used.

Whereas particular embodiments of the invention have been described herein for the purpose of illustrating the invention and not for the purpose of limiting the same, it will be appreciated by those of ordinary skill in the art that numerous variations of the details, materials, configurations and arrangement of parts may be made within the principle and scope of the invention without departing from the spirit of the invention. The preceding description, therefore, is not meant to limit the scope of the invention.

What is claimed is:

1. Apparatus for supporting and mounting at least one module on a surface, said apparatus comprising:
   a housing attachable to a portion of the surface, said housing having a channel therein sized to receive and support at least a portion of at least one module therein, and the channel being covered by a cover panel sized to the channel on a side opposite the portion of the surface; and
   at least one mounting member on said housing for attaching said housing to the surface;
   wherein a slot extends between the cover panel and the portion of the surface that is capable of receiving the at least one module by moving the at least one module into the slot in a direction parallel to the cover panel and that is sized to guide the at least one module into the slot and the channel, the at least one module being retained between the surface and the cover panel in at least partial contact with the surface.

2. The apparatus of claim 1, wherein said housing comprises a three-sided box.

3. The apparatus of claim 2, wherein one end of said three-sided box is enclosed.

4. The apparatus of claim 1, wherein said at least one mounting member comprises at least one magnet.

5. The apparatus of claim 1, wherein said at least one mounting member comprises hook and loop fasteners.

6. The apparatus of claim 1, wherein said housing is configured to cooperate with fasteners for fastening said at least one modules to said housing.

7. A housing for supporting and mounting at least one module, said housing comprising:
   a first panel member;
   a second panel member connected to said first panel member;
   a third panel member connected to said second panel member opposite said first panel member, wherein a slot is formed between said first and third panel members capable of receiving at least one module, the slot is capable of receiving the at least one module by moving the at least one module into the slot in a direction toward the second panel member, and the slot is sized to guide the at least one module into the slot;
   a cover panel member attached to the first, second, and third panel members such that the cover panel member is sized to and covers a side of the slot; and
   at least one mounting member capable of mounting said housing to a surface, wherein at least one of the first and third panel members includes the at least one mounting member, and the surface and cover panel member are opposite each other and retain the at least one module therebetween in at least partial contact with the surface.

8. The housing of claim 7, wherein said slot is U-shaped and sized to slidably receive said at least one module.

9. The housing of claim 7, wherein said first panel member has a first extended side and wherein said third panel has a second extended side.

10. The housing of claim 7, wherein said first panel member has at least one first orifice and said third panel member has at least one second orifice, and the at least one first orifice and the at least one second orifice are positioned opposite the second panel member.

11. The housing of claim 10, wherein said at least one first orifice and said at least one second orifices are positioned to receive fasteners attached to said at least one module to secure said at least one module on said housing.

12. The housing of claim 10, wherein said first panel member has at least one lower hole positioned transverse to said at least one first orifice, and wherein said third panel member has at least one upper hole positioned transverse to said at least one second orifice.

13. The housing of claim 12, wherein said at least one mounting member is at least two mounting members positioned through said at least one lower hole and said at least one upper hole for mounting said housing to the surface.

14. The housing of claim 7, wherein said at least one mounting member is a magnet for removably mounting said housing to a magnet attracting surface.

15. The housing of claim 14, wherein said magnet includes at least one magnetic strip attached to at least one side of said housing.

16. The housing of claim 7, wherein said housing further comprises a rear panel connected to said first, second and third panels and positioned parallel to said slot.

17. Apparatus for mounting at least one module on a surface, said apparatus comprising:

housing means attachable to the surface for forming a channel for receiving at least a portion of said at least one module therein between a portion of said housing means and the surface, the channel being covered by a cover panel sized to the channel on a side opposite the surface, and the at least one module being retained between the cover panel and the surface in at least partial contact with the surface; and means for mounting said housing means to the surface, wherein the mounting means is included in the housing means and mounts the housing means such that the surface and cover panel are opposite each other.

18. A method of mounting at least one module on an RT cabinet the method comprising:

forming an open ended channel on a portion of the cabinet, the open ended channel being covered by a cover panel sized to the channel on a side opposite the portion of the cabinet;

inserting at least a portion of the at least one module into the open ended channel by moving the at least one module into the open ended channel between the cover panel and the portion of the cabinet in a direction parallel to the portion of the cabinet, the cover panel and portion of the cabinet operating to guide the at least one module into the open ended channel;

retaining the at least one module within the open ended channel, wherein the at least one module is retained between the portion of the cabinet and the cover panel in at least partial contact with the portion of the cabinet;

wherein the forming comprises attaching the open ended housing to a surface of the portion of the cabinet such that the open ended channel is disposed between the cover panel and the surface, the open ended housing being attached to the surface by at least one mounting member included on at least one of two opposite sides of the open ended channel.

19. The method of claim 18, wherein the open ended channel is formed with only one open end through which at least a portion of the at least one module is inserted.

20. The method of claim 18, wherein said retaining comprises engaging a fastener on a portion of the at least one module with a portion of a housing forming the open ended channel, the portion of the housing being positioned opposite a closed end of the open ended channel.

21. The method of claim 18, wherein the at least one mounting member includes at least one fastener selected from the group consisting of fasteners containing magnets, hook and loop fasteners and screws.

* * * * *